United States Patent [19]

Compton et al.

[11] 4,066,917
[45] Jan. 3, 1978

[54] CIRCUIT COMBINING BIPOLAR TRANSISTOR AND JFET'S TO PRODUCE A CONSTANT VOLTAGE CHARACTERISTIC

[75] Inventors: James B. Compton, Los Gatos; Sam S. Ochi, San Jose, both of Calif.

[73] Assignee: National Semiconductor Corporation, Santa Clara, Calif.

[21] Appl. No.: 682,290

[22] Filed: May 3, 1976

[51] Int. Cl.² .................... H01L 29/80; H01L 27/02; H03K 17/60
[52] U.S. Cl. ................................ 307/304; 307/251; 307/297; 357/22; 357/43
[58] Field of Search ................ 307/251, 297, 304; 357/22, 43

[56] References Cited
U.S. PATENT DOCUMENTS

| | | | |
|---|---|---|---|
| 3,303,413 | 2/1967 | Warner, Jr. et al. | 307/304 X |
| 3,369,129 | 2/1968 | Wolterman | 307/304 X |
| 3,458,801 | 7/1969 | Polson | 307/304 X |
| 3,603,811 | 9/1971 | Day et al. | 307/304 X |
| 3,708,694 | 1/1973 | Evans | 307/304 X |
| 3,723,892 | 3/1973 | Julie | 307/304 X |
| 3,898,477 | 8/1975 | Buchanan | 307/304 X |
| 3,916,222 | 10/1975 | Compton | 307/304 X |

Primary Examiner—Larry N. Anagnos
Attorney, Agent, or Firm—Gail W. Woodward; Willis E. Higgins

[57] ABSTRACT

A pair of FET's are coupled in series between the emitter and collector of a bipolar transistor and the juncture of the FET's coupled to the bipolar transistor base. The FET gates are coupled to the bipolar transistor collector. When a current is passed through the emitter-collector terminals in excess of a threshold value, a constant voltage will appear over a substantial current range. The constant voltage is related to FET Vp and can be used to compensate or track integrated circuits that contain both FET's and bipolar transistors.

4 Claims, 4 Drawing Figures

U.S. Patent  Jan. 3, 1978  4,066,917
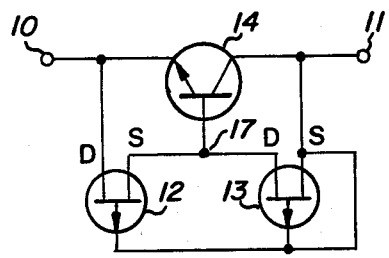
Fig_1
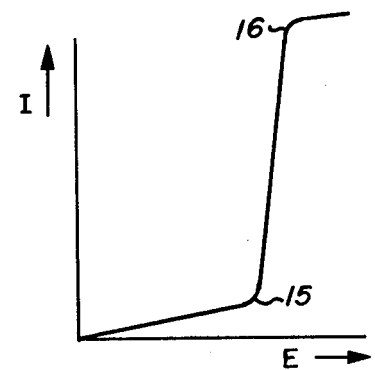
Fig_2
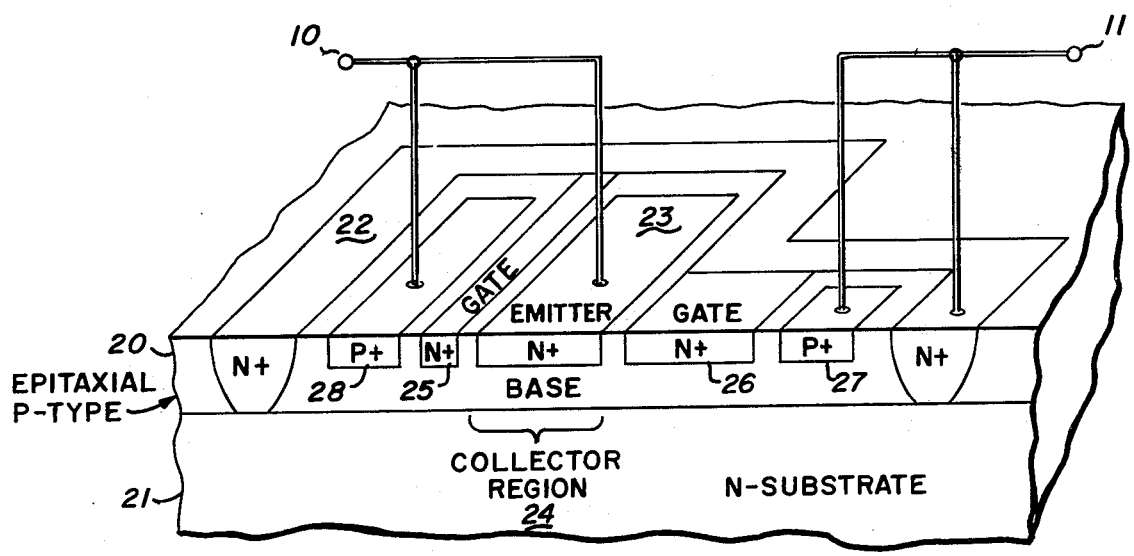
Fig_3
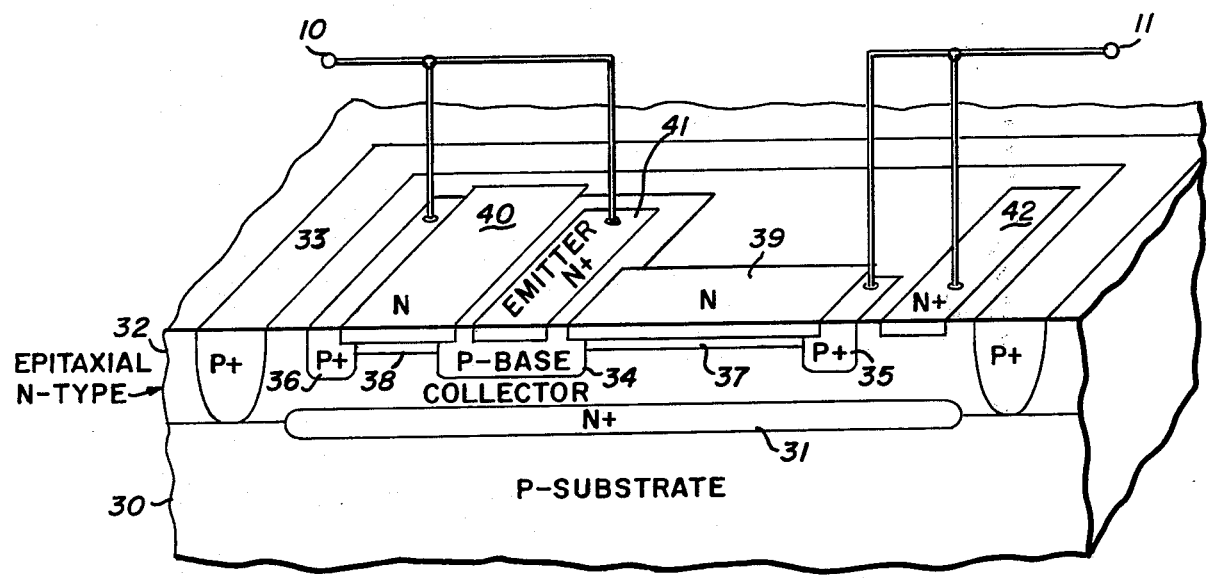
Fig_4

4,066,917

CIRCUIT COMBINING BIPOLAR TRANSISTOR AND JFET'S TO PRODUCE A CONSTANT VOLTAGE CHARACTERISTIC

BACKGROUND OF THE INVENTION

The invention herein is disclosed, but not claimed, in our copending application Ser. No. 676,096 filed Apr. 12, 1976, and titled FIELD EFFECT TRANSISTOR SWITCH.

In the prior art it has often been found advantageous to combine field effect transistors (FET's) with bipolar transistors to achieve superior circuit performance. In particular integrated circuit (IC) designs have benefited greatly from such combinations. In IC applications it has been found that while the FET's on a particular chip all tend to have the same pinchoff voltage (Vp), the actual value is difficult to control. Accordingly unless stringent Vp control is employed in the IC process, some form of adjustment of circuit operation must be used or the circuits must be limited to those in which FET Vp is not critical. Such adjustment must be achieved after chips are fabricated and is difficult to implement as well as costly.

SUMMARY OF THE INVENTION

It is an object of the invention to provide a circuit that develops a constant voltage that is a function of FET Vp wherein the voltage can be used to compensate circuits that include both FET's and bipolar transistors.

It is a further object of the invention to provide a simple two-terminal IC component that develops a voltage that is proportional to FET Vp so that other FET components on the IC can be compensated to function with bipolar transistors.

These and objects are achieved using a bipolar transistor in combination with two FET's. The FET source drain circuits are series connected between emitter and collector of the bipolar transistor and the juncture of the FET's connected to the bipolar transistor base. The FET gates are connected to the bipolar transistor collector. When current is passed through the bipolar transistor the FET's will clamp the voltage drop between collector and base to a fixed proportion of Vp above a threshold current value. Thus the total voltage developed will be about KVp + 0.6 volt for silicon devices where K is determined by the ratio of $I_{DSS}$ of the two FET devices. Desirably the FET's are ratioed to make sure that the clamp boltage is close to Vp. The constant voltage is useful in compensating circuits that contain both FET's and bipolar transistors. This permits such combinations without having to carefully control FET Vp which is difficult. The circuit has particular application to IC's because it is easy to make all of the FET's on a chip have the same Vp but very difficult to hold Vp to a controlled value.

BRIEF DESCRIPTION OF THE DRAWING

FIG. 1 is a schematic diagram of the circuit of the invention;

FIG. 2 is a graph showing the current-voltage characteristic of the circuit of FIG. 1;

FIG. 3 is a partly in cross section view of an IC form of the circuit of FIG. 1; and FIG. 4 is a partly in cross section view of another IC form of the circuit of FIG. 1.

DESCRIPTION OF THE INVENTION

FIG. 1 illustrates the circuit of the invention. Current is passed between terminals 10 and 11. For the device polarities shown, terminal 11 will be maintained positive with respect to terminal 10. An NPN current pass transistor 14 is connected between terminals 10 and 11 and transistor bias is obtained from the juncture of two FET's, 12 and 13, which provide a parallel current path around transistor 14. Since the gate of FET 13 is returned to its source, it acts as a self-biased device. FET 12 has its gate biased by the source to drain voltage of FET 13.

The behavior of the circuit is best understood by reference to the current-voltage curve of FIG. 2, where the current is plotted as the ordinate against voltage on the absicesa. At very low current values transistor 14 is non-conductive and all of the current flows through FET's 12 and 13 which act as non-saturated "on" resistors. In this region of the curve, the voltage rises linearly with current up to a point 15 which is the level at which transistor 14 begins to conduct. This will occur when the base becomes about 0.6 volt positive with respect to the emitter. With further current increase, a greater proportion of the total current is carried by transistor 14 so that an increase in current produces a lesser increase in voltage. This is the constant voltage region of the circuit. When point 16 is reached, a condition is set up where FET 13 pinches off and becomes a constant current device while FET 12 ceases to conduct. In this region the circuit becomes a constant current device with currents proportional to $I_{DSS}$ of FET 13 times the beta of transistor 14.

In order for the circuit to act as a constant voltage device at the lower current values, the FET's must be ratioed. If the channel conduction of FET 12 equaled that of FET 13, the voltage at node 17 with respect to terminal 10 would be ½ Vp when the FET's are pinched off. However, if FET 12 conduction is made greater than that of FET 13, the voltage division will be such that node 17 with respect to terminal 10 will be a fraction of the terminal 11 potential with respect to terminal 10. In the ideal case the division ratio will be adjusted so that the emitter base voltage of transistor 14 will just turn transistor 14 on when the collector-emitter voltage of transistor 14 equals the FET pinch off voltage. It can be seen that when Vp is reached, the current that formerly flowed in FET 12 is forced into the base of transistor 14 thereby causing its collector current to become a strong function of terminal 10 to 11 voltage. Thus point 15 on the curve occurs at Vp and the current value at this point will be the saturation current of FET 13, or $I_{DSS}$. The constant voltage region extends to point 16 where the terminal voltage has risen to Vp + 0.6 volt. This means that transistor 14 is on and its collector-base voltage equals Vp. Here FET 13 is in saturation and in turn pinches off FET 12. Thus $I_{DSS}$ for FET 13 will flow in the base of transistor 14. This means that in FIG. 2, point 16 will occur at a current equal to transistor current gain or beta multiplied by $I_{DSS}$. When using a transistor having a beta of 1000 the circuit will produce a constant voltage over a current span of three orders of magnitude or $I_{DSS}$ to $I_{DSS} \times 1000$.

As mentioned above, the ideal situation is when Vp occurs at a voltage that, when divided by the ratioed FET conduction, equals transistor turn on ($V_{DSS}$ of FET 12 equals 0.6 volt.) If the FET conduction ratio is too small, the curve of FIG. 2 will soften and have a reduced constant voltage span in terms of current. However, if the ideal conduction ratio is exceeded, which means that FET 13 is made correspondingly smaller, the current level at point 15 will merely be reduced while maintaining the sharp break into the constant voltage region. Thus in terms of circuit performance it is preferred that FET 12 simply be made much larger than FET 13.

Since a silicon transistor 14 conducts at an emitter-base voltage of about 0.6 volt, the FET conduction ratio of one would be used for a Vp of 1.2 volts. In a typical silicon IC the Vp is ordinarily on the order of 5 volts maximum. This requires a conduction ratio of 99:1. Therefore in such devices a 100:1 conduction ratio will ensure good constant voltage performance. If a still higher Vp is to be used, the ratio must be increased.

In FIG. 3, a planar IC version of FIG. 1 is presented. A cross section taken through the IC structure is shown along with a portion of the adjoining semiconductor surface. The oxide film associated with the planar device processing has been removed for clarity as has the normally associated metalization. The metal connections are illustrated in schematic form with numerals that relate the circuit to FIG. 1. It is also to be realized that for the sake of clarity FIG. 3 is not drawn to scale and only shows a single circuit of the invention. In actual practice this circuit will be integrated into other circuitry and a multiplicity of such circuits processed simultaneously on a semiconductor wafer as is conventional in the art.

The starting material is an N-type silicon wafer with a surface coating of epitaxial P-type material. After epitaxial layer 20 is grown onto wafer substrate 21, a ring of N-type material 22 is diffused, as shown, completely through layer 20. This ring is heavily doped and makes a low resistance contact to substrate 21. This diffusion isolates the P-type epitaxial layer inside the ring from the remainder of the structure. A conventional emitter diffusion is used to create N+ type region 23 which when properly biased with respect to the adjacent P-type material will inject minority carriers therein. The injected carrier can be collected by the facing portion, region 24, of the substrate. While region 23 is being formed, two gate contacts, 25 and 26, are formed as shown so that they touch or overlap ring 22 and are thereby connected to ring 22. Since ring 22 is in fact the transistor collector connection, gates 25 and 26 are directly connected and need no separate connections. The semiconductor structure is completed with heavily doped or P+ type diffusions at 27 and 28. These constitute the source of FET 13 and the drain of FET 12 respectively. Since the drain of FET 13 and the source of FET 12 join in the base region of the transistor under emitter 23, these elements are in common and need no further connection to achieve the schematic connection shown in FIG. 1. To complete the circuit, emitter 23 is connected to rain contact 28 to comprise terminal 10 and source 27 is connected to collector contact 22 (along with gates 25 and 26) to comprise terminal 11.

It will be noted that since gate 25 is shorter and wider than gate 26 the associated FET which corresponds to 12 of FIG. 1 will be more conductive in the on state. Also since the two FET's are constructed to have the same thickness of channel material will have the same Vp values.

From the above it can be seen that the circuit lends itself to IC fabrication. The FET conduction ratio is easily realized by the differing size of gate contacts 25 and 26. The semiconductor parameters are well suited to forming bipolar transistors having excellent performance and for the structure shown, the FET's can be made to have suitably compatible performance.

FIG. 4 shows an alternative embodiment that produces superior transistor and FET performance and is compatible with present IC processing. Accordingly it is to be regarded as the preferred embodiment of the invention. The general statements about FIG. 3 also apply to FIG. 4. In FIG. 4 it can be seen that the complete structure is fully p-N junction isolated from the semiconductor substrate.

The starting material is a P-type silicon wafer 30. Before epitaxy a heavily doped N+ type region 31 is diffused into the surface of substrate 30. After the N-type epitaxial layer 32 is grown, a buried layer is established. An isolation P-type diffusion ring 33 passes entirely through the epitaxial layer to contact the substrate. This isolates the enclosed structure from the remainder of the substrate by the P-N junction.

The transistor base is established by a P-type diffusion 34 and simultaneously FET electrodes 35 and 36 are formed. Electrode 35 is to be the source of FET 13 (FIG. 1) and electrode 36 will be the drain of FET 12. Base 34 will also comprise the drain of FET 13 and source of FET 12. These connections are internal so that no metallic base connection is needed. P-type regions 37 and 38 constitute the FET channel regions for FET's 13 and 12 respectively. These regions can be achieved by diffusion or, as preferred, by ion implantation as is well known in the art. In order to protect and isolate channels 37 and 38 they are provided with covers 39 and 40 which are shallow N layers that can be formed using diffusion or, as preferred, by ion implantation as is well known in the art. Regions 39 and 40 are designed to fully overlap channels 37 and 38 and to make ohmic connection where they overlap onto the N-type epitaxial material. Region 41 is a conventional heavily doped or N+ diffused emitter and collector contact 42 is diffused simultaneously with the emitter. As shown schematically, regions 36 and 41 are connected together to comprise terminal 10 and regions 35 and 42 are connected together to comprise terminal 11.

The structure of FIG. 4 has several benefits. The entire circuit is P-N junction isolated and the buried layer 31 reduces parasitic resistance in the N-type material to a very low value. Channels 37 and 38 can be precisely ratioed and, being located below the surface of the semiconductor, are very stable. Since ion implantation can be used to form the channels and gates their thickness can be made quite small so that low Vp values are easily achieved and reproduced.

A new and useful constant voltage circuit has been disclosed, along with structural embodiments suitable for integration into IC devices. However there are alternatives and equivalents that will occur to a person skilled in the art. For example the structures all show NPN transistors and P-channel FETs. By reversing the substrate, epitaxial, and diffused or ion bombarded conductivity types, PNP transistors along with N-channel FETs could be connected to IC elements involving both PNP and NPN bipolar transistors, as well as N and P channel FETs. Accordingly it is intended that our invention be limited only by the following claims.

We claim:

1. An integrated circuit having both bipolar transistors and FET devices integrated on a common substrate and having a portion thereof that develops a constant volage when a current is passed in excess of a predetermined value, said portion comprising;
- a bipolar transistor having emitter, base, and collector regions;
- a first FET located in close proximity with said bipolar transistor and having a drain region in common with said base region of said bipolar transistor, a source region coupled to said collector region of said bipolar transistor, and a gate region in common with said collector region of said bipolar transistor;
- a second FET located in close proximity with said bipolar transistor and having a source region in common with said base region of said bipolar transistor, a drain region coupled to said emitter region of said bipolar transistor, and a gate region in common with said collector region of said bipolar transistor;
- means to electrically isolate said portion from the remainder of said integrated circuit, and
- terminal means coupled to said emitter and said collector regions of said bipolar transistor.

2. The circuit of claim 1 wherein said portion contains an NPN transistor and P-channel FET devices.

3. The circuit of claim 1 wherein said portion contains a PNP transistor and N-channel FET devices.

4. The circuit of claim 1 wherein said second FET has a larger on state conduction than said first FET.

* * * * *